Nov. 28, 1961 YASUSHI WATANABE ET AL 3,011,104

SEMICONDUCTOR DIODES

Filed July 27, 1960

United States Patent Office 3,011,104

Patented Nov. 28, 1961

3,011,104

SEMICONDUCTOR DIODES

Yasushi Watanabe, 3–87 Anto, Shizuoka, and Jun-ichi Nishizawa, 56 Komegafukuro Nakachyo, Sendai, Japan Filed July 27, 1960, Ser. No. 45,625
Claims priority, application Japan July 31, 1959
8 Claims. (Cl. 317—234)

Our invention relates to electronic semiconductor diodes, such as germanium and silicon diodes, and will be described with reference to the accompanying drawing in which.

The known semiconductor diodes of the junction type may be looked upon as being of the lumped-constant type. This applies, for example, to the alloy-bonded or diffusion-bonded diode illustrated in FIG. 1. Such a diode comprises a wafer or body 1 of semiconductor material which has one side face-to-face bonded with an ohmic-contact electrode 2. Another electrode 3 is alloyed or fused together with the opposite side of the semiconductor wafer and contains lattice-deflection impurity substance so that a p-n junction is formed between a reversely doped region in the semiconductor body immediately adjacent to the electrode 3, and the main region of the semiconductor body. For example, if the semiconductor body consists of n-type germanium, the electrode 3 contains acceptor substance so that a p-type conductance region is formed adjacent to the electrode 3 in order to produce the p-n junction schematically indicated at 4. The electrode 3 is connected with, or forms part of, an input conductor 5. The electrode 2 is connected with an output conductor or conductive heat sink when the diode is in use.

Figures 1, 2, 3:
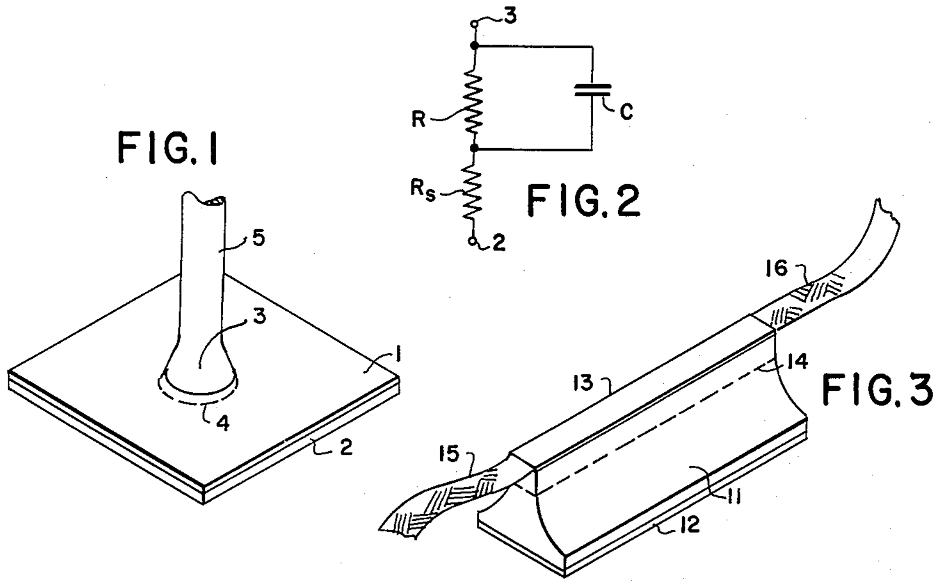
FIG. 1 shows schematically, in perspective, a semiconductor diode of known design and FIG. 2 a corresponding equivalent circuit diagram for explanatory purposes.
FIG. 3 shows schematically, in perspective, a semiconductor diode according to the invention and FIG. 4 a corresponding equivalent circuit diagram.

As shown in FIG. 2, such a diode comprises internal resistance R, $R_s$ and internal capacitance C in parallel to the resistance R. The efficiency of a semiconductor junction diode of the type exemplified above declines considerably when the operating frequency of the applied alternating voltage exceeds the limit frequency where $\omega_c CR_s \approx 1$ or $\omega_c CR \approx 1$. For realizing a higher cut-off frequency $\omega_c/(2\pi)$, the diode must be made to have small capacitance C. Reducing the capacitance C, however, inevitably results in also decreasing the current conducting area, thus reducing the applicable amount of electric power. With junction diodes, the so-called parametron effect or negative resistance is sometimes utilized for amplifying or oscillation generating purposes. In this case, however, the decrease in conducting area and the resulting increase in impedance make it difficult to provide for proper impedance matching, or an appreciable leakage becomes apparent with the result that the power and heat losses in the diode are no longer negligible. Since too small an impedance also increases such losses, the possibility of providing for appropriate impedance and hence for a corresponding current-conducting area is manifestly desirable.

It is an object of our invention to devise semiconductor junction diodes of improved high-frequency characteristics as compared with the lumped-constant type devices heretofore available. More particularly, it is among the objects to raise the cut-off frequency of such diodes, and to improve their efficiency and currents-carrying capacity at high frequencies.

Another object of our invention is to make semiconductor junction diodes inherently suitable for operation as filters, amplifiers, oscillators, memorizing or data-storing devices for various purposes of high-frequency operation.

According to our invention, we depart from the above-mentioned design principle of lumped-constant diodes and give the semiconductor body, the p-n junction within that body, as well as the two electrodes joined with the semiconductor regions of respectively different conductance type, a greatly elongated shape, so that the diode assumes the characteristics of a distributed-constant device. More specificially, we give the semiconductor body and its p-n junction a length which is a multiple of its width, and we give the two electrodes a similar shape so that they extend longitudinally along, and substantially parallel to, the junction area.

The foregoing and more specific objects and features of our invention, said features being set forth with particularity in the claims annexed hereto, will be further described with reference to the embodiments of semiconductor junction diodes according to the invention illustrated by way of example in FIGS. 3 to 6 of the accompanying drawing.

The diode illustrated in FIG. 3 comprises a semiconductor main body 11 with an elongated rectangular base surface and a likewise rectangular and elongated top surface of smaller area than the base surface. Bonded to the base surface by alloying or diffusion is an ohmic-contact electrode 12. Similarly bonded to the top surface is another electrode 13. The region adjacent to electrode 13 has a conductance type different from the region adjacent to the electrode 12, thus forming a p-n junction as schematically indicated at 14. An input lead 15 is attached to one end of the elongated top electrode 13, and an output lead 16 is attached to the other end of the same electrode, it being understood that one or two additional leads are connected to the electrode 12 which has greater thickness and electric conductance than the top electrode 13 so that the latter constitutes a distributed impedance along the elongated semiconductor body.

The diode according to FIG. 3 may be produced in accordance with the known manufacturing methods employed for the conventional lumped-constant type diodes. Depending upon the particular purpose of the device, the semiconductor body 11 may consist of germanium, silicon, or intermetallic semiconductor compounds known for such purposes. When using silicon of originally p-type conductance, the base electrode 12 may consist of aluminum and the top electrode 13 may consist of gold-antimony alloy so that the antimony, during the alloying or diffusion operation employed for fusing the electrode to the semiconductor body 14, migrates into the germanium and forms an n-type region adjacent to the electrode 13, with the result that the above-mentioned p-n junction is formed at 14.

Figure 4:
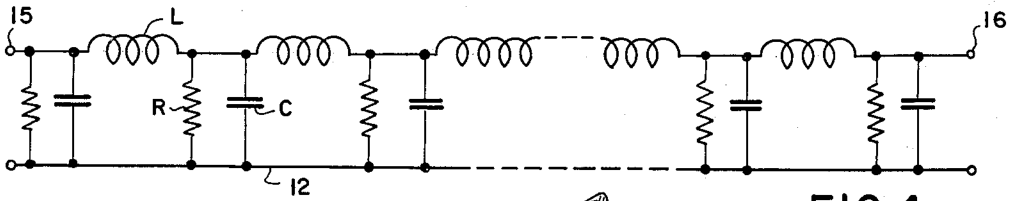

As shown in FIG. 4, the diode may be represented by an equivalent circuit which constitutes a distributed-constant transmission network composed of series inductances L, parallel capacitances C and parallel resistances R. This network can be expressed by the parameter expressions: $j\omega Ldx$ and $gdx$, $j\omega Cdx$, generally applying to a resonant transmission line as constituted by a pair of parallel Lecher wires. If the conductivity $g=1/R$ is positive and large, an increase in length of the diode will incur a decrease in gain. However, if $g$ is small or negative, excellent characteristics are obtained so that a larger gain and a larger available electric power are obtained, especially at high frequency.

Figure 5:
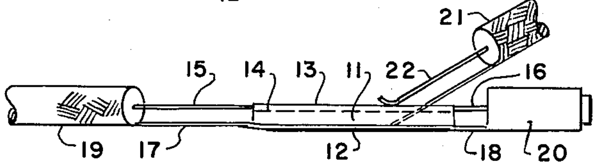
FIG. 5 illustrates a diode according to FIGS. 3 and 4 used as a coupler between a coaxial transmission line and a terminating impedance device.

According to FIG. 5, a diode as shown in FIG. 3 is used as a coupler between a coaxial transmission line 19 and a terminating impedance device 20 matched to the characteristic impedance of the line. The electrode 13 is connected by lead 15 with the inner conductor of line 19, and the electrode 12 is connected by a lead 17 with the outer conductor of the line. The impedance device 20 is connected to electrodes 13 and 12 by respective leads 16 and 18. If the input signal, entering from the coaxial cable 19, is not completely matched by the terminating device 20, a standing wave is created and can be taken out from the position of its voltage loop. This may be done by means of another coaxial cable 21 which has one conductor attached to the electrode 12, while the other conductor is displaceable in contact with the electrode 13. The device is thus applicable for measuring purposes in the manner of a Lecher line. Various similar combinations are available and wave filtering characteristics can be readily obtained as well as directional characteristics without the necessity of using gyrator components. When the diode is used as a parametron amplifier, the driving voltage can be given to the same electrode from which the output voltage can be selectively taken off.

Figure 6:
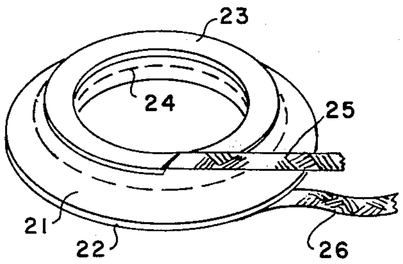
FIG. 6 illustrates in schematical perspective a ring-shaped tunnel diode according to the invention suitable as an oscillator.

FIG. 6 shows an example of an oscillator formed by a tunnel diode, especially a negative resistance diode. The device is ring shaped and forms an oscillatory closed circuit whose oscillating frequency is almost entirely dependent upon the length of the circumference. The semiconductor body 21, its p-n junction 24 and electrodes 22, 23 correspond to the respective items denoted by 11 to 24 in FIG. 3, and the cross section of the ring-shaped device is also similar to that of the straight diode according to FIG. 3. Two leads 25 and 26 are attached to the electrodes 23 and 22 respectively, both joining these electrodes at substantially the same location of the circumference.

Such ring-shaped diodes afford obtaining a large electric power at high frequency. Furthermore, when the signal is superimposed upon the high frequency applied to the device, amplification of the signal is obtained almost in only one direction since the gain differs depending upon the direction of signal transmission. Consequently the amplifier has a directional characteristic on the circumference, and it also has a feed-back character depending upon the frequency characteristic or the velocity of transmission. Since the device functions as an amplifier as well as an oscillator, there arises simultaneously a variation in distribution capacity, thus securing the function of a parametron amplifier. If there are two kinds of wave lengths on the circumference due to different oscillation frequencies, not only parametron amplification but also negative resistance amplification is involved. Generally, the same applies to other kinds of odd-number wave lengths.

A device of the type shown in FIG. 6 may be used for separate parametron driving. This has the advantage that the band width is larger than in the case of the ordinary driving method. When operating, for instance, with a ferrite core excited by direct-current voltage or a direct-current magnetic field, a driving alternating-current voltage of a certain frequency-band width can be supplied continuously, since these waves whose length is within a specific range are temporarily stored in the ring owing to the capacity of the device of amplifying waves over a considerably wide range of wave length, although the oscillating frequency varies in this case. There are two kinds of devices of the same type, applicable for oscillation and for storage purposes alone.

Since electromagnetic waves can be oscillated in a given direction, such a device can be used as a memorizing apparatus by connecting a switch with a non-linear capacitor or other non-linear circuit component in a portion of a closed circuit, for instance a ring-shaped circuit or network component. By virtue of the constant-amplitude characteristic, such devices are also applicable as addition-subtraction circuits.

The above-described examples will suffice to indicate that the invention has a wide scope of application. In particular, excellent characteristics are exhibited as a frequency multiplying or reducing device. Such devices are also applicable satisfactorily for facsimile reproduction by controlling the devices by incidence of light. The device as shown in FIG. 6 also affords the immediate releasing of FM oscillations.

While in the illustrated examples the application of direct-current displacement or biasing voltage is omitted, such voltage can be applied wherever needed in practice. As mentioned, the semiconductor substances used for diodes according to the invention may consist not only of silicon or germanium but also of intermetallic semiconductor compounds.

We claim:

1. A semiconductor diode comprising a semiconductor body having two regions of different conductance type to form a p-n junction and having two electrodes joined with said respective regions, said body and junction having greater length than width, said electrodes being elongated along said body, and two conductors joined with one of said electrodes at respective longitudinal ends thereof so that the diode has distributed-constant type impedance along said body.

2. A semiconductor diode comprising an elongated semiconductor body whose length is a multiple of its width and has two regions of different conductance type forming a p-n junction within and along said body, two elongated electrodes joined with said respective regions along said body, and two conductors joined with one of said electrodes at respective longitudinal ends thereof whereby the diode has a linear Lecher-line characteristic of the distributed-constant type.

3. A semiconductor diode comprising a semiconductor body having two regions of different conductance type to form a p-n junction and having two electrodes joined with said respective regions, said body and junction having greater length than width, said electrodes being elongated along said body, one of said two electrodes having longitudinal high-frequency impedance and the other having negligible longitudinal impedance, whereby the diode has a resonance characteristic of the distributed-constant type, along said body.

4. A semiconductor diode according to claim 3 comprising input and output leads attached to said one electrode at the two longitudinal ends thereof.

5. In a semiconductor diode according to claim 1, said semiconductor body having annular shape, and said junction and electrodes extending along the entire circumference of said body so as to form respective closed annular shapes.

6. In a semiconductor diode according to claim 1, said semiconductor body having a wide base surface and a narrow top surface, said two electrodes being face-to-face bonded to said respective surfaces and having substantially the same widths as said respective surfaces.

7. In a semiconductor diode according to claim 3, said one electrode having along said semiconductor body a constant width smaller than the width of said other electrode.

8. In a semiconductor diode according to claim 1, said semiconductor body having the shape of a circular ring and having a base surface of large radial width and a top surface of small radial width, said junction and electrodes extending along the entire circumference of said body so as to form respective closed annular shapes, and said two electrodes having large and small radial widths along said base surface and said top surface respectively, said top-surface electrode having larger circumferential impedance than said base-surface electrode, and circuit leads connected to said respective two electrodes.

References Cited in the file of this patent

UNITED STATES PATENTS

| | | |
|---|---|---|
| 2,897,421 | Kruper | July 28, 1959 |
| 2,913,676 | Pankove | Nov. 17, 1959 |
| 2,963,390 | Dickson | Dec. 6, 1960 |